Figure 1:
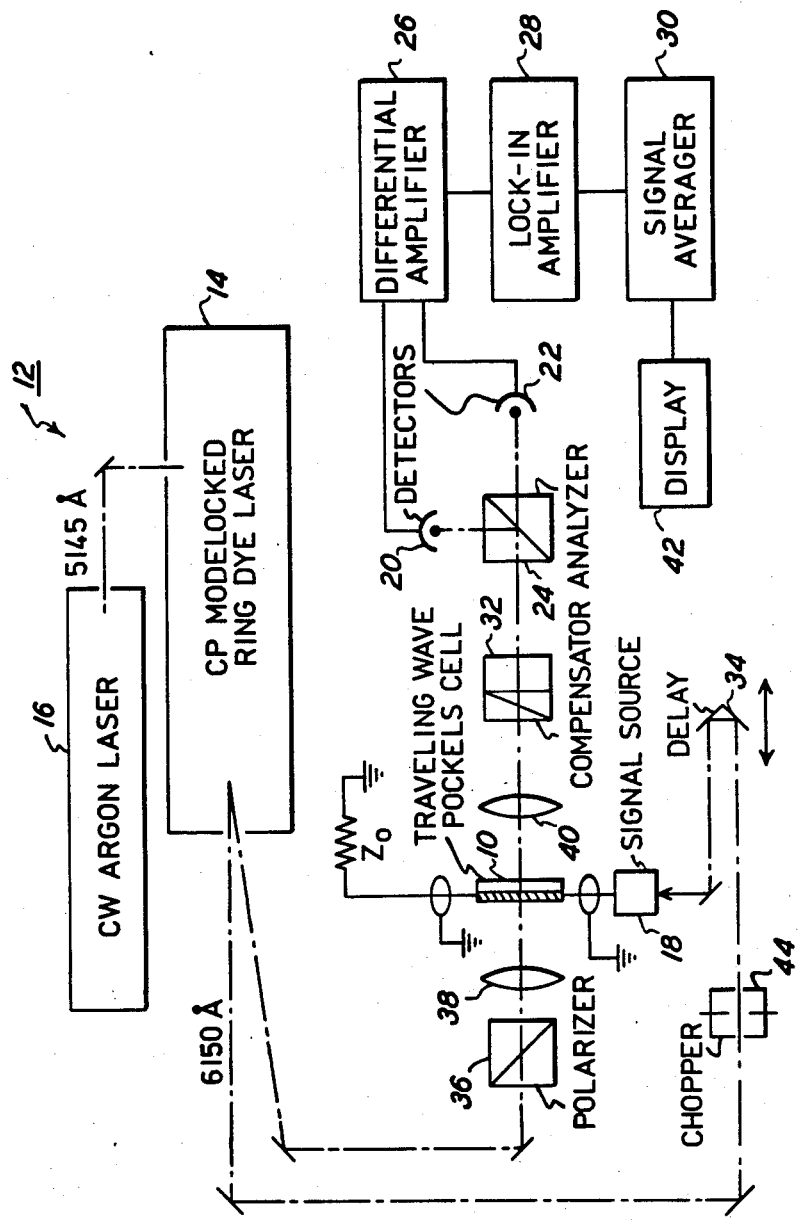

United States Patent [19]

Mourou et al.

[11] Patent Number: 4,618,819
[45] Date of Patent: Oct. 21, 1986

[54] MEASUREMENT OF ELECTRICAL SIGNALS WITH SUBPICOSECOND RESOLUTION

[75] Inventors: Gerard Mourou, Rochester, N.Y.; Janis A. Valdmanis, Westfield, N.J.

[73] Assignee: The University of Rochester, Rochester, N.Y.

[21] Appl. No.: 593,993

[22] Filed: Mar. 27, 1984

[51] Int. Cl.$^4$ .................................................. G01R 23/16
[52] U.S. Cl. ................................... 324/77 K; 324/96; 350/356
[58] Field of Search ........................................ 370/1–4; 350/371, 377, 392, 394, 395, 356; 324/77 R, 77 K, 96

[56] References Cited

U.S. PATENT DOCUMENTS

| | | | |
|---|---|---|---|
| 3,432,222 | 3/1969 | Fleisher | 350/371 |
| 3,556,663 | 1/1971 | Cary | 350/371 |
| 4,147,979 | 4/1979 | Baues et al. | 324/96 |
| 4,253,060 | 2/1981 | Chen | 324/77 K |
| 4,446,425 | 5/1984 | Valdmanis | 324/77 K |

OTHER PUBLICATIONS

Valdmanis & Mourou, "Subpicosecond Electrical Sampling and Applications, Chapter 8, Picosecond Optoelectronic Devices, 1984, pp. 249–270.
Valdmanis et al, "Picosecond Electro-optic Sampling System", Appl. Phys. Lett. 41(3) Aug. 1, 1982, pp. 211, 212.
Valdmanis, "Subpicosecond Electrical Sampling", IEEE, Journal of Quant. Elec., QE19, No. 4, Apr. 83, pp. 664–667.
Reprinted from Electronic Letters, 6/20/85, vol. 21, No. 13, pp. 568, 569, "Two Dimensional E–Field Mapping with Subpicosecond Temporal Resolution".
Meyer and Mourou, "Two Dimensional E–Field Mapping with Subpicosecond Resolution", U of Rochester, 250 E. River Road, Rochester, NY, 14623, pp. 46–49.

*Primary Examiner*—Michael J. Tokar
*Attorney, Agent, or Firm*—Martin LuKacher

[57] ABSTRACT

Electrical signals are measured (analyzed and displayed) with subpicosecond resolution by electro-optic sampling of the signal in an electro-optic crystal, the index of which changes in response to the electric field produced by the signal, in accordance with the Pockels effect. The crystal is disposed adjacent to and in the fringe field of a line on a substrate, which may be part of an integrated circuit, for measuring signals propagating along the line during the operation of the circuit. A beam of short optical (laser) sampling pulses in the picosecond range is focused preferably close to the surface of the crystal and perpendicular to the optical axis of the crystal. The optical pulses transmitted through the crystal are processed to provide a display affording a measurement of the electrical signal.

11 Claims, 4 Drawing Figures

MEASUREMENT OF ELECTRICAL SIGNALS WITH SUBPICOSECOND RESOLUTION

DESCRIPTION

The present invention relates to methods and apparatus for measurement of electrical signals with subpicosecond resolution, and particularly to methods and apparatus for electro-optic sampling of electrical signals with the aid of an electro-optic crystal, the index of refraction of which changes in response to the electrical signal in accordance with the Pockels effect. The invention makes it possible to measure transient electrical signals with subpicosecond resolution, thereby enabling the measurement of electrical signals having bandwidths in the tetrahertz range ($10^{12}$ Hz).

Sampling of an electrical signal with picosecond temporal resolution has been accomplished with the use of a traveling wave Pockels cell made up of an electro-optic crystal of lithium niobate or lithium tantalate on opposite surfaces of which a microwave strip, transmission line for the signals is provided. This system is described in U.S. patent application Ser. No. 348,127 filed Feb. 12, 1982 in the name of J. A. Valdmanis and G. Mourou and assigned to the same assignee as the present application, now U.S. Pat. No. 4,446,425, issued May 1, 1984. This application has been published under the Patent Cooperation Treaty as International Publication No. WO83/02829 on Aug. 18, 1983. The system is also the subject of an article entitled "Picosecond Electro-optic Sampling System" by J. A. Valdmanis et al., *Appl. Phys. Lett.*, Vol. 41-3, 211, Aug. 1982.

It has been discovered in accordance with the invention that the fringe field of lines along which the electrical signals to be measured propagate can be sampled to measure the signals. The crystal is disposed in the field and the optical beam is passed through the crystal oriented so that a component of its optical field is in parallel relationship with the field at a localized, small sampling point in the crystal. A sampling system of the type described in the above referenced publications is operable to measure signals with a bandwidth expanding to the tetrahertz range and with subpicosecond resolution.

It is therefore an object of the present invention to provide improved methods and apparatus for the measurement of electrical signals by electro-optic sampling of the signals as they propagate along an electro-optic crystal.

It is a still further object of the present invention to provide methods and apparatus for measurement of electrical signals which propagate on lines (conductors) of integrated circuits by electro-optic sampling of the fringe field produced by such signals adjacent to the lines with the aid of electro-optic crystal.

Briefly described, measurement of electrical signals with subpicosecond resolution in accordance with an embodiment the invention is responsive to such signals in a transmission line along which the signals propagate which creates an electric field adjacent to the line. An electro-optic crystal is disposed adjacent to and outside of the line so that the electrical field passes through at least a portion of the crystal and changes the index of refraction thereof in accordance with the Pockels effect. A beam of optical pulses is passed through the crystal to electro-optically sample the signal. The beam is passed in a direction transversely of the direction of the field to optically sample successively occurring portions of the signal as it propagates. The samples are then processed to provide a display of the signal with subpicosecond resolution.

Figure 2:
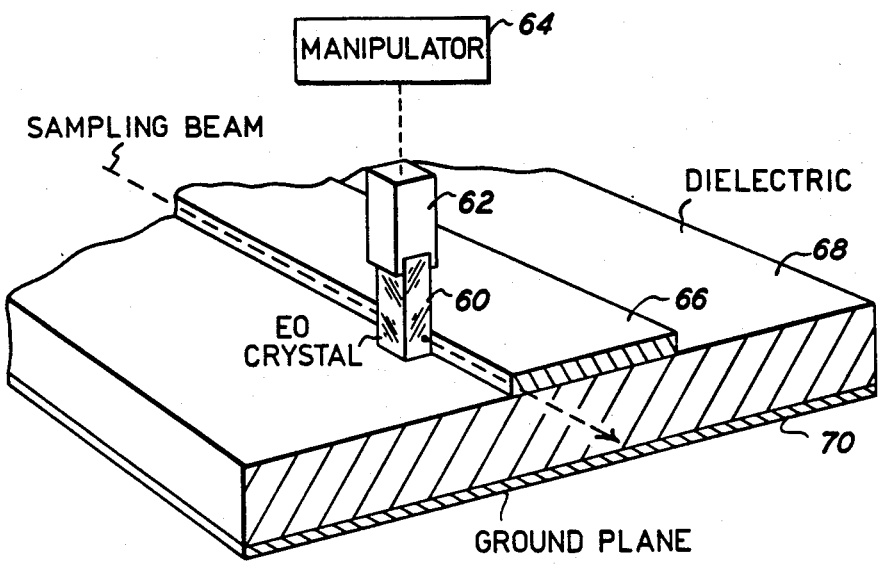
Figure 2A:
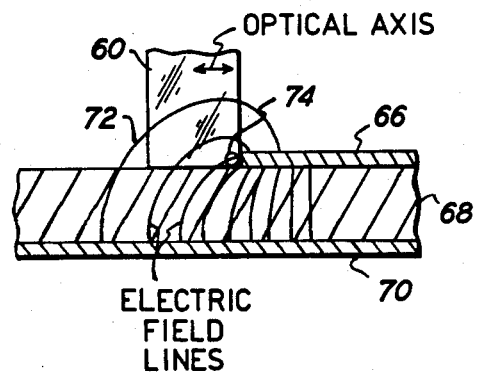
Figure 3:
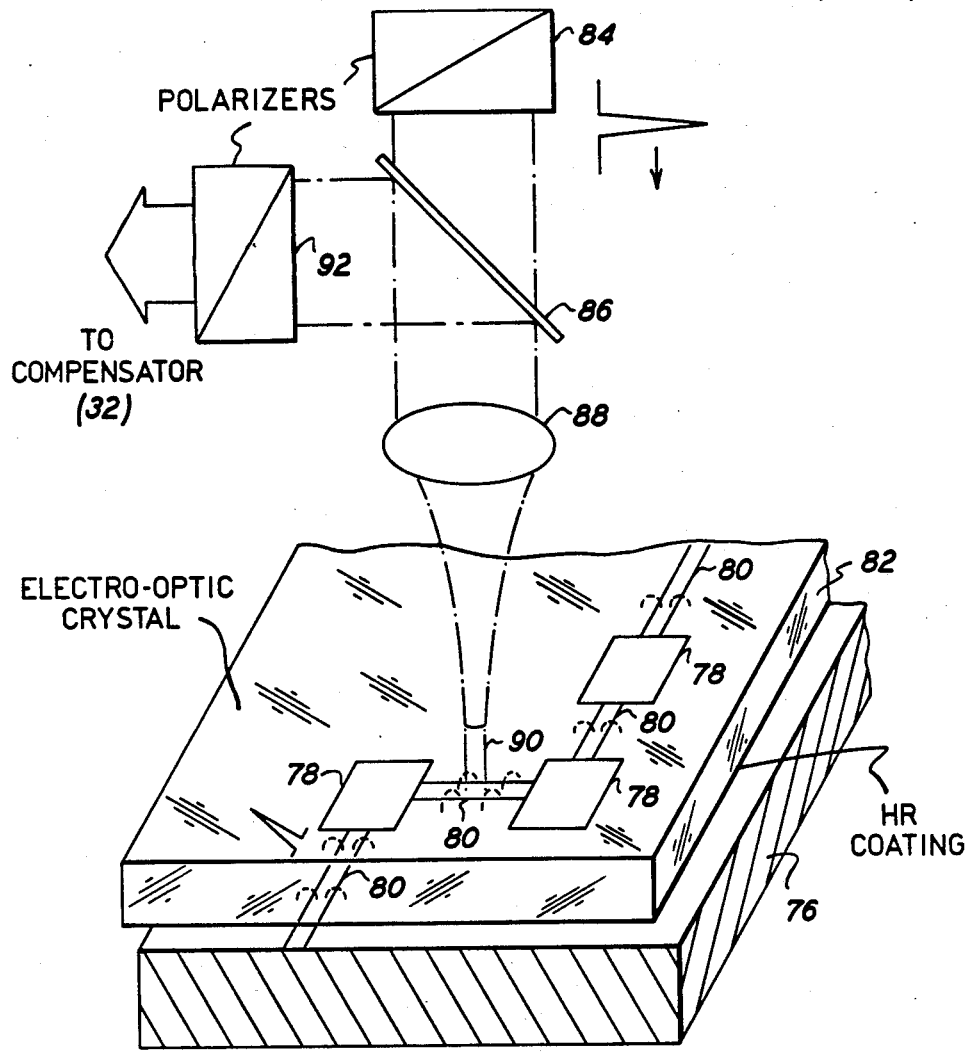

The foregoing and other objects, features and advantages of the invention as well as presently preferred embodiments thereof and the best modes presently known for carrying out the invention, will become more apparent from a reading of the following description in connection with the accompanying drawings in which:

FIG. 1 is a block diagram of an electro-optic sampling system of the type described in the above referenced publications and utilizing a traveling waveguide Pockel cell so as to extend the resolution of the measurement and the high end cutoff frequency of electrical signals which can be sampled and measured;

FIGS. 2 and 2a are a perspective and an enlarged sectional view illustrating the measurement of electrical signals using an electro-optic crystal in the fringe field of a micro-strip transmission line which provides a cell for electro-optic sampling of the electrical signal propagated along the micro-strip line using a sampling system such as illustrated in FIG. 1; and FIG. 3 is a perspective view diagrammatically illustrating the use of an electro-optic crystal by means of which signals propagating along lines of an integrated circuit may be sampled with the aid of a system such as shown in FIG. 1.

Referring to FIG. 1 there is shown a system of the type described in the above identified publications. Reference may be had to these publications for more detailed description as to the design and operation of the system. Briefly, however, the system uses a traveling wave Pockel cell incorporating a electro-optic crystal of lithium tantalate or lithium niobate; lithium tantalate being presently preferred. The cell may be formed by placing the electro-optic crystal adjacent to a transmission line existing on a substrate, such as the micro-strip transmission line shown in FIG. 2 and the transmission lines of an integrated circuit, as shown in FIG. 3.

The system utilizing the cell which is shown at 10 in FIG. 1 uses an optical pulse generator 12 made up of a colliding pulse mode-locked laser 14 pumped by a CW argon laser 16. The colliding pulse mode-locked laser is in the form of a ring dye laser. The laser 14 generates very short pulses, for example, 120 femtoseconds (fs) in duration at a 100 MHz rate. These pulses drive an electrical signal source 18 and also synchronously sample the electric field produced by the signal as it propagates across the crystal of the cell 10. Two photodetectors 20 and 22 are used to measure the intensities of the transmitted and rejected beams at an analyzer 24. The signals from the detectors are processed by a differential amplifier 26, a lock-in amplifier 28 and a signal averager 30. The electro-optic sampling process is biased by a compensator 32 at the quarter wave point to achieve linear response and maximum voltage sensitivity. An optical delay device 34 enables temporal scanning of the entire electrical signal profile by the optical probe pulses of light from a polarizer 36 which is focused by a lens 38 in the crystal of the cell 10. Another lens 40 transmits the beam of pulses transmitted through the crystal to the compensator 32 and thence to the analyzer 24. A display 42, such as a CRT display, has its horizontal axis driven linearly with the delay line, and its vertical axis by the output from the signal averager 30. This results in a linear voltage versus equivalent time representation of the unknown electrical signal and requires no further processing. Relatively slow detectors can be used since their necessary bandwidth is dictated only by the frequency of a light chopper 44 used in conjunction with the lock-in amplifier 28.

Referring to FIGS. 2 and 2a there is shown a cell utilizing an electro-optic crystal 60 without conductors on its surface and which is connected through a support 62 to a manipulator 64, suitably a micro-manipulator. The crystal is disposed adjacent to the edge of a micro-strip conductor 66 with its end surface bearing upon a substrate 68 on which the micro-strip is deposited. The micro-strip conductor may work opposite a ground plane conductor 70 so as to provide a fringe field as illustrated by the lines 72 in FIG. 2a. The crystal 62 has a region adjacent to the edge of the micro-strip conductor 66. The sampling electro-optic beam is focused in the area indicated by the circle 74 in FIG. 2a such that its optical field has a component parallel to the electric field and preferably, also to the optical axis of the crystal 60. The electrical signal propagates along the micro-strip and is sampled in the crystal. The sampling beam goes to the compensator 32 (FIG. 1) and then to the rest of the sampling system so that the signals may be displayed. If a number of conductors are disposed on the substrate 68 the manipulator may be used to bring the crystal adjacent to the edges of these conductors so as to measure the electrical signals which propagate along such other conductors.

Referring to FIG. 5 there is shown a substrate 76 on which integrated circuit components 78, for example active devices such as transistors and/or diodes are disposed (viz., a micro-circuit). The signals are transmitted between the devices 78 by transmission lines provided by conductors 80. To make measurements of these signals an electro-optic crystal 82 is placed with a surface thereof on the surface of the substrate 76 on which the devices 78 and the conductors 80 are disposed. The field from the conductors then penetrates the crystal. An optical probe beam is generated in the laser and transmits optical pulses to a polarizer 84. These pulses pass through a beam splitter 86 and are focused by a lens 88 to provide a region 90 of the beam in the crystal where the field from one of the transmission lines 80 penetrates the crystal and produces the birefringence. As in the other embodiment, the orientation of the beam is desirably such that a component of the optical field and a component of the electrical field are both parallel to the optical axis of the crystal 82. The surface of the crystal 82, which is juxtaposed on the surface of the substrate on which the devices 78 and the lines 80 are deposited, has a high reflection (HR) coating. Accordingly, the optical beam is reflected from this coating, passes back through the crystal 82, through the focusing lens 88 and is reflected by the beam splitter 86 to a polarization analyzer 92. The output beam then goes to the compensator 32 and the rest of the system shown in FIG. 1. The integrated circuit is operated in sychronism with the optical pulses through the delay 34 so as to develop outputs showing the profile of the electrical signals. The beam splitter 86 may be a polarization sensitive beam splitter which passes one polarization downwardly to the electro-optic crystal 82. The use of the polarizers and beam splitter may be avoided by tilting the beam with respect to the crystal 82 and the substrate 76. The reflected beam will then clear the lens 88 and go on to the compensator.

From the foregoing description it will be apparent that there has been provided improved methods and apparatus for measurement of electrical signals having frequency components of very high frequency, in the tetrahertz range with temporal resolution in the subpicosecond range, through the use of cells which may be placed adjacent lines carrying the signals to detect the field therethrough. Variations and modifications in the herein described methods and apparatus, within the scope of the invention, will undoubtedly suggest themselves to those skilled in the art. Accordingly, the foregoing description should be taken as illustrative and not in a limiting sense.

We claim:

1. The method of measuring an electrical signal on a line in a micro-circuit with subpicosecond resolution which comprises the steps of propagating said signal along a line on a substrate of said micro-circuit which creates an electric fringe field adjacent thereto, placing an electro-optic crystal of dimensions of the same order as the micro-dimensions of said line adjacent and outside of said line and said substrate so that said field passes through at least a portion of said crystal and changes the index of refraction thereof and the polarization of optical radiation therethrough in accordance with the Pockels effect, passing a beam of optical pulses through said crystal in a direction transverse to the direction of said field to optically sample successively occurring portions of said signal, and processing said samples to provide a display of said signal.

2. The method according to claim 1 wherein said crystal has an optical axis, orienting said beam to bring a component of the optical field thereof into parallel relationship with said optical axis.

3. The method according to claim 1 including the step of orienting said beam and said line with respect to each other so that at least a component of the optical field of said beam and said electric field are in parallel relationship.

4. The method according to claim 3 including the step of orienting said crystal, beam and line with respect to each other so that the optical axis of said crystal, said electric field and a component of said optical field are in parallel relationship.

5. The method according to claim 1 wherein said line is deposed on said substrate and said placing step is carried out by placing said crystal with one of its surfaces adjacent to said substrate and another of its surfaces adjacent to an edge of said line.

6. The method according to claim 1 wherein said line comprises a conductive element on the surface of the substrate, placing a reflective coating on a surface of said crystal, and placing said crystal with its reflective surface on said surface of said substrate, said passing step is carried out by passing said beam through a surface of said crystal opposite to the surface having said reflective coating so that said beam passes through said crystal to said reflective coating and is reflected from said coating to provide said samples for processing.

7. Apparatus for measuring an electrical signal in a micro-circuit with subpicosecond resolution which signal propagates along a line on a substrate of said micro-circuit and which creates an electric fringe field adjacent thereto, said apparatus comprising an electro-optic crystal of dimensions of the same order as the dimensions of said micro-circuit disposed adjacent to and outside of said line and substrate so that said field passes through at least a portion of said crystal and changes the index of refraction thereof and the polarization of optical radiation therethrough in accordance with the Pockels effect, means for generating a beam of optical pulses synchronous with said signals and oriented to pass through said crystal in a direction transverse to the direction of said field to optically sample successively occurring portions of said signal, and means for processing said samples to provide a display of said signal.

8. The apparatus according to claim 7 wherein said crystal has an optical axis, said beam having such orientation with respect to said optical axis that a component of the optical field of said beam is in parallel relationship with said optical axis.

9. The apparatus according to claim 7 including means for orienting said beam and said line with respect to each other so that at least a component of the optical field of said beam and said electric field are in parallel relationship.

10. The apparatus according to claim 1 wherein said line is deposed on the surface of said substrate, and said crystal is disposed with one of its surfaces adjacent to said substrate and another of its surfaces adjacent to an edge of said line.

11. The apparatus according to claim 1 wherein said line comprises a conductive element on the surface of the substrate, a reflective coating on a surface of said crystal, and said crystal is disposed with its reflective surface on said surface of said substrate, said beam is incident on a surface of said crystal opposite to the surface having said reflective coating so that said beam passes through said crystal to said reflective coating and is reflected from said coating to provide said samples to said processing means.

* * * * *